(12) United States Patent
Hu et al.

(10) Patent No.: US 10,930,189 B2
(45) Date of Patent: Feb. 23, 2021

(54) SHIFT REGISTER UNIT, METHOD FOR DRIVING THE SAME, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Shenghua Hu, Beijing (CN); Chunyang Nie, Beijing (CN); Bingbing Yan, Beijing (CN); Lixin Zhu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 96 days.

(21) Appl. No.: 16/320,753

(22) PCT Filed: Apr. 13, 2018

(86) PCT No.: PCT/CN2018/082997
§ 371 (c)(1),
(2) Date: Jan. 25, 2019

(87) PCT Pub. No.: WO2018/228042
PCT Pub. Date: Dec. 20, 2018

(65) Prior Publication Data
US 2019/0164465 A1    May 30, 2019

(30) Foreign Application Priority Data
Jun. 13, 2017   (CN) .......................... 201710441791.5

(51) Int. Cl.
*G11C 19/00* (2006.01)
*G09G 3/20* (2006.01)
(Continued)

(52) U.S. Cl.
CPC .............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 8,019,039 B1 *  9/2011  Tsai ...................... G11C 19/28
                                                        377/64
8,330,702 B2 * 12/2012  Miyake ................. H01L 27/088
                                                        345/100
(Continued)

FOREIGN PATENT DOCUMENTS

| CN | 102654984 A | 9/2012 |
| CN | 102682699 A | 9/2012 |
| CN | 107424552 A | 12/2017 |

OTHER PUBLICATIONS

CN107424552A, English Abstract and Machine Translation.
(Continued)

*Primary Examiner* — Tuan T Lam
(74) *Attorney, Agent, or Firm* — Brooks Kushman P.C.

(57) ABSTRACT

A shift register unit, a method for driving the same, a gate driving circuit, and a display device are provided. The shift register unit includes a driving circuit, a storage capacitor circuit, an output circuit, and a reset circuit. Under the control of the start end, the driving circuit controls whether the pull-up node is connected to the set signal input end and
(Continued)

control whether the pull-down node is connected to the first level input end. Under the control of the reset end, the reset circuit controls whether the pull-up node is connected to the first level input end, and controls whether the pull-down node is connected to the second level input end.

8 Claims, 3 Drawing Sheets

(51) Int. Cl.
   *G11C 19/28* (2006.01)
   *G09G 3/36* (2006.01)
(52) U.S. Cl.
   CPC ............... *G09G 2310/0286* (2013.01); *G09G 2310/061* (2013.01); *G09G 2310/08* (2013.01)

(56) References Cited

U.S. PATENT DOCUMENTS

| | | | | |
|---|---|---|---|---|
| 10,580,377 | B2 * | 3/2020 | Li | G09G 3/2092 |
| 10,593,286 | B2 * | 3/2020 | Wu | G09G 3/20 |
| 2006/0125518 | A1 * | 6/2006 | Morosawa | G11C 19/28 |
| | | | | 326/38 |
| 2007/0248204 | A1 * | 10/2007 | Tobita | G11C 19/28 |
| | | | | 377/64 |
| 2010/0150303 | A1 | 6/2010 | Tsai et al. | |
| 2012/0188210 | A1 * | 7/2012 | Zhang | G09G 3/3677 |
| | | | | 345/204 |
| 2014/0140468 | A1 * | 5/2014 | Cheng | G11C 19/28 |
| | | | | 377/68 |
| 2016/0071614 | A1 * | 3/2016 | Lee | G11C 19/28 |
| | | | | 345/214 |
| 2016/0125954 | A1 * | 5/2016 | Gu | G09G 3/3688 |
| | | | | 377/64 |
| 2016/0300623 | A1 * | 10/2016 | Yang | G11C 19/28 |
| 2016/0372070 | A1 * | 12/2016 | Hu | G09G 3/36 |
| 2018/0308408 | A1 * | 10/2018 | Chen | G11C 19/28 |

OTHER PUBLICATIONS

CN102682699A, English Abstract and Machine Translation.
CN102654984A, English Abstract and Machine Translation.
International Search Report and Written Opinion for Application No. PCT/CN2018/082997, dated Jun. 28, 2018, 10 Pages.

* cited by examiner

SHIFT REGISTER UNIT, METHOD FOR DRIVING THE SAME, GATE DRIVING CIRCUIT AND DISPLAY DEVICE

CROSS-REFERENCE TO RELATED APPLICATIONS

This application is the U.S. national phase of PCT Application No. PCT/CN2018/082997 filed on Apr. 13, 2018, which claims priority to Chinese Patent Application No. 201710441791.5 filed on Jun. 13, 2017, which are incorporated herein by reference in their entireties.

TECHNICAL FIELD

The present disclosure relates to the field of a display technology, in particular to a shift register unit, a method for driving the same, a gate driving circuit and a display device.

BACKGROUND

A structure of the shift register unit in a related art is a 4T1C structure, and its basic structure is simple and includes a start signal input transistor, an output transistor, two reset transistors, and a bootstrap capacitor. The shift register unit in the related art may realize that the gate driving signal outputs a valid level only for a certain time, and outputs an invalid level for the remaining time. However, due to the coupling effect between the gate electrode of a thin film transistor (TFT) and the source/drain electrode thereof in the related art (in the related art, the gate electrode of the output transistor is connected to a clock signal input end, since the clock signal input end is continuously outputting a high or low level, dither of all gate drive signal outputs may occur), the gate driving signal outputted from a 4T1C shift register unit in the related art will jitter with the change of the clock signal during the invalid period, so the stability of the gate driving signal is poor.

SUMMARY

In one aspect, the present disclosure provides in some embodiments a shift register unit, including: a driving circuit; a storage capacitor circuit; an output circuit; and a reset circuit, wherein the driving circuit is respectively connected to a starting end, a pull-up node, a pull-down node, a first level input end and a set signal input end, and configured to control whether the pull-up node is connected to the set signal input end and whether the pull-down node is connected to the first level input end under the control of the start end; the output circuit is respectively connected to the pull-up node, the pull-down node, the first level input end, an output signal providing end, and a gate driving signal output end in a current stage, and configured to control whether the gate driving signal output end in the current stage is connected to the output signal providing end under the control of a voltage at the pull-up node, and whether the gate driving signal output end in the current stage is connected to the first level input end under the control of a voltage at the pull-down node; the storage capacitor circuit is connected between the pull-up node and the gate driving signal output end in the current stage; and the reset circuit is respectively connected to a reset end, a second level input end, the pull-up node, the pull-down node, and the first level input end, and configured to control whether the pull-up node is connected to the first level input end under the control of the reset end, and control whether the pull-down node is connected to the second level input end.

In some embodiments, the driving circuit comprises a first driving transistor and a second driving transistor; a gate electrode of the first driving transistor is connected to the start end, a first electrode of the first driving transistor is connected to the pull-up node, and a second electrode of the first driving transistor and the set signal input end; and a gate electrode of the second driving transistor is connected to the start end, a first electrode of the second driving transistor is connected to the first level input end, a second electrode of the second driving transistor is connected to the pull-down node.

In some embodiments, the reset circuit comprises a first reset transistor and a second reset transistor; a gate electrode of the first reset transistor is connected to the reset end, a first electrode of the first reset transistor is connected to the pull-down node, and a second electrode of the first reset transistor is connected to the second level input end; and a gate electrode of the second reset transistor is connected to the reset end, a first electrode of the second reset transistor is connected to the pull-up node, and a second electrode of the second reset transistor is connected to the first level input end.

In some embodiments, the output circuit includes a first output transistor and a second output transistor; a gate electrode of the first output transistor is connected to the pull-down node, a first electrode of the first output transistor is connected to the first level input end, a second electrode of the first output transistor is connected to the gate driving signal output end; and a gate electrode of the second output transistor is connected to the pull-up node, a first electrode of the second output transistor is connected to the gate driving signal output end in the current stage, and a second electrode of the second output transistor is connected to the output signal providing end.

In some embodiments, the first driving transistor, the second driving transistor, the first output transistor, the second output transistor, the first reset transistor, and the second reset transistor are all n-type transistors.

In some embodiments, the first driving transistor, the second driving transistor, the first output transistor, the second output transistor, the first reset transistor, and the second reset transistor are all p-type transistors.

In some embodiments, the storage capacitor circuit comprises a storage capacitor, a first end of the storage capacitor is connected to the pull-up node, and a second end of the storage capacitor is connected to the gate driving signal output end in the current stage.

In another aspect, a method for driving the shift register unit includes: within each display period, in an initial stage, the set signal input end and the start end both inputting a second level, and the output signal providing end inputting a first level; under the control of the start end, the drive circuit controlling to connect the pull-up node and the set signal input end, and connect the pull-down node and the first level input end; so that a potential of the pull-up node is at the second level and a potential of the pull-down node is at the first level; and under the control of a voltage at the pull-up node, the output circuit controlling to connect the driving signal output end in the current stage to the output signal providing end, so that the driving signal output end in the current stage outputs the first level; in an output stage, the set signal input end and the start end both inputting the first level, and the output signal providing end inputting the second level; under the control of the start end, the drive circuit controlling to disconnect the pull-up node and the set signal input end, and controlling to disconnect the pull-down node and the first level input end, the storage capacitor circuit bootstrapping the potential of the pull-up node; under the control of a voltage at the pull-up node, the output circuit continuing to control the driving signal output end in the current stage to be connected to the output signal providing end, so that the gate driving signal output end in the current stage outputs the second level; in a reset phase, the reset end inputting a second level, and under the control of the reset end, the reset circuit controlling the pull-up node to be connected to the first level input end, and controlling the pull-down node to be connected to the second level input end, so that the potential of the pull-up node is at a first level and the potential of the pull-down node is at a second level; under the control of a voltage at the pull-up node, the output circuit controlling to disconnect the gate driving signal output end in the current stage and the output signal providing end; under the control of a voltage at the pull-down node, the output circuit controlling the gate driving signal output end in the current stage to be connected to the first level input end, to reset the gate driving signal output end in the current stage.

In yet another aspect, a gate driving circuit includes a plurality of stages of shift registers units. In addition to the shift register unit in the last stage, the gate signal output end of the shift register unit in each stage is connected to the start end of a shift register unit in an adjacent next stage.

In some embodiments, the set signal input end of the shift register unit in a 4n-3rd stage is connected to a first clock signal input end, and the output signal providing end of the shift register unit in the 4n-3rd stage is connected to a second clock signal input end, and the reset end of the shift register unit in the 4n-3rd stage is connected to a third clock signal input end; a set signal input end of shift register unit in a 4n-2nd stage is connected to the second clock signal input end, and the output signal providing end of the shift register unit in the 4n-2nd stage is connected to the third clock signal input end, the reset end of the shift register unit in the 4n-2nd stage is connected to a fourth clock signal input end; the set signal input end of the shift register unit in a 4n-1st stage is connected to the third clock signal input end, and the output signal providing end of the shift register unit in the 4n-1st stage is connected to the fourth clock signal input end, the reset end of the shift register unit in the 4n-1st stage is connected to the first clock signal input end; the set signal input end of the shift register unit in a 4nth stage is connected to the fourth clock signal input end, and the output signal providing end of the shift register unit in the 4nth stage is connected to the first clock signal input end, and the reset end of the shift register unit in the 4nth stage is connected to the second clock signal input end, where n is a positive integer, and 4n is less than or equal to a quantity of stages of the shift register units included in the gate driving circuit; duty ratios of a first clock signal, a second clock signal, a third clock signal, and a fourth clock signal are all 1/4, and periods of the first clock signal, the period of the second clock signal, the period of the third clock signal, and the period of the fourth clock signal are all T; and the second clock signal is delayed by T/4 from the first clock signal; the third clock signal is delayed by T/4 from the second clock signal; the fourth clock signal is delayed by T/4 from the third clock signal.

In still yet another aspect, a display device includes the above gate driving circuit.

DETAILED DESCRIPTION

The technical solutions in the embodiments of the present disclosure are clearly and completely described in the following with reference to the accompanying drawings. It is obvious that the described embodiments are only a part of the embodiments of the present disclosure, and not all of the embodiments. All other embodiments obtained by a person skilled in the art based on the embodiments of the present disclosure are within the scope of the disclosure.

Transistors used in all embodiments of the present disclosure may each be a thin film transistor or a field effect transistor or other device having the same characteristics. In the embodiments of the present disclosure, in order to distinguish two electrodes of the transistor other than the gate electrode, one of the two electrodes is referred to as a first electrode, and the other is referred to as a second electrode. In actual operation, the first electrode may be a drain electrode, and the second electrode may be a source electrode; or the first electrode may be a source electrode, and the second electrode may be a drain electrode.

Figure 1:
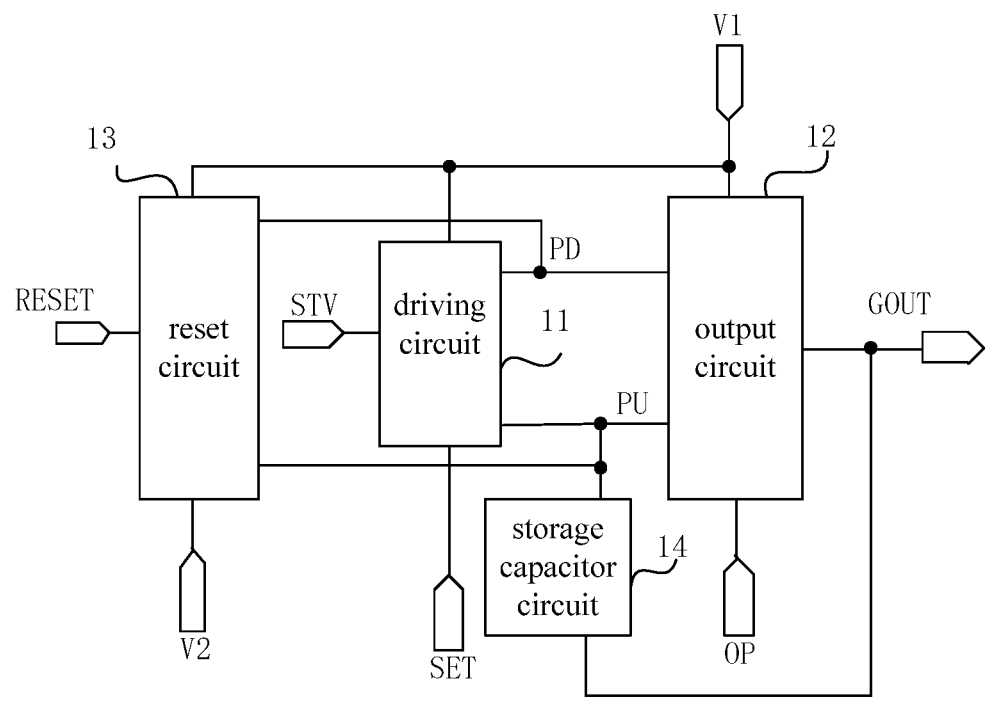
FIG. 1 is a schematic view showing a structure of the shift register unit according to some embodiments of the present disclosure.

As shown in FIG. 1, the shift register unit of an embodiment of the present disclosure includes a driving circuit 11, an output circuit 12, a reset circuit 13, and a storage capacitor circuit 14.

The driving circuit 11 is respectively connected to a starting end STV, a pull-up node PU, a pull-down node PD, a first level input end V1 and a set signal input end SET. The driving circuit 11 is configured to control whether the pull-up node PU is connected to the set signal input end SET and whether the pull-down node PD is connected to the first level input end V1 under the control of the start end STV.

The output circuit 12 is respectively connected to the pull-up node PU, the pull-down node PD, the first level input end V1, an output signal providing end OP, and a gate driving signal output end GOUT in a current stage. The output circuit 12 is configured to control whether the gate driving signal output end GOUT in the current stage is connected to the output signal providing end OP under the control of a voltage at the pull-up node PU, and whether the gate driving signal output end GOUT in the current stage is connected to the first level input end V1 under the control of a voltage at the pull-down node PD.

The storage capacitor circuit 14 is connected between the pull-up node PU and the gate driving signal output end GOUT in the current stage.

The reset circuit 13 is respectively connected to the reset end RESET, the second level input end V2, the pull-up node PU, the pull-down node PD, and the first level input end V1. The reset circuit 13 is configured to control whether the pull-up node PU is connected to the first level input end V1 under the control of the reset end RESET, and control whether the pull-down node PD is connected to the second level input end V2.

The shift register unit of the embodiment of the present disclosure includes an output circuit that controls whether the gate driving signal output end in the current stage is connected to the output signal providing end under the control of a voltage at the pull-up node, so that the dither of the gate driving signal does not occur. The shift register unit according to the embodiments of the present disclosure use less TFTs to obtain a stable and high-quality gate driving signal, thus a narrow bezel can be realized.

Specifically, a first level inputted by the first level input end V1 may be a low level, and a second level inputted by the second level input end V2 may be a high level. In actual operation, the specific level values of the above two levels may be changed according to actual conditions, and are not limited to the above mentioned values.

The shift register unit includes: a driving circuit, an output circuit, and a reset circuit. The driving circuit is configured to input a set signal to the output circuit, and the output circuit is configured to output a final gate driving signal so as to turn on the channel of TIF at an active area (AA). The reset circuit is configured to reset the gate driving signal so as to turn off the channel of the TFT at the AA.

Specifically, the driving circuit may include a first driving transistor and a second driving transistor. A gate electrode of the first driving transistor is connected to the start end, a first electrode of the first driving transistor is connected to the pull-up node, and a second electrode of the first driving transistor and the set signal input end. A gate electrode of the second driving transistor is connected to the start end, a first electrode of the second driving transistor is connected to the first level input end, a second electrode of the second driving transistor is connected to the pull-down node.

Specifically, the reset circuit may include a first reset transistor and a second reset transistor. A gate electrode of the first reset transistor is connected to the reset end, a first electrode of the first reset transistor is connected to the pull-down node, and a second electrode of the first reset transistor is connected to the second level input end. A gate electrode of the second reset transistor is connected to the reset end, a first electrode of the second reset transistor is connected to the pull-up node, and a second electrode of the second reset transistor is connected to the first level input end.

Specifically, the output circuit includes a first output transistor and a second output transistor. A gate electrode of the first output transistor is connected to the pull-down node, a first electrode of the first output transistor is connected to the first level input end, a second electrode of the first output transistor is connected to the gate drive signal output end. A gate electrode of the second output transistor is connected to the pull-up node, a first electrode of the second output transistor is connected to the gate driving signal output end in the current stage, and a second electrode of the second output transistor is connected to the output signal providing end.

Optionally, the first driving transistor, the second driving transistor, the first output transistor, the second output transistor, the first reset transistor, and the second reset transistor may all be n-type transistors; or the first driving transistor, the second driving transistor, the first output transistor, the second output transistor, the first reset transistor, and the second reset transistor may all be p-type transistors.

Optionally, all of the transistors included in the shift register unit of the embodiments of the present disclosure are n-type or p-type TFTs, which can reduce the quantity of masks used in the process, and the cost is more easily reduced.

Specifically, the storage capacitor circuit may include a storage capacitor. A first end of the storage capacitor is connected to the pull-up node, and a second end of the storage capacitor is connected to the gate driving signal output end in the current stage.

The shift register unit will be described below by way of a specific embodiment.

Figure 2:
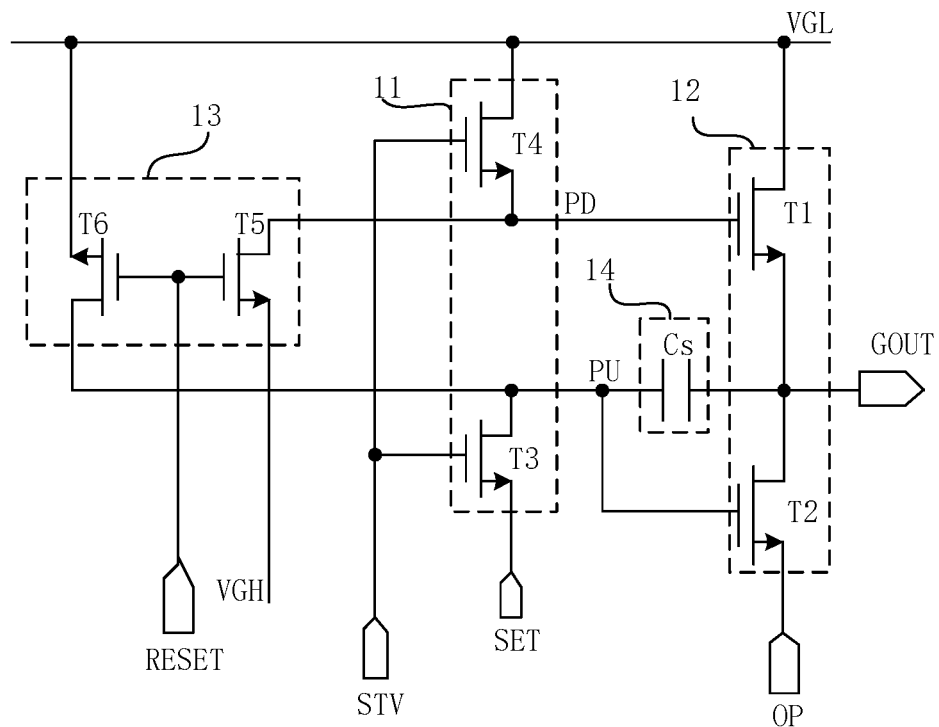
FIG. 2 is a circuit showing the shift register unit according to some embodiments of the present disclosure.

As shown in FIG. 2, the shift register unit includes a driving circuit 11, an output circuit 12, a reset circuit 13, and a storage capacitor circuit 14.

The driving circuit 11 includes a first driving transistor T3 and a second driving transistor T4. A gate electrode of the first driving transistor T3 is connected to the start end STV, a drain electrode of the first driving transistor T3 is connected to the pull-up node PU, a source electrode of the first driving transistor T3 is connected to the set signal input end SET. A gate electrode of the second driving transistor T4 is connected to the start end STV, a drain electrode of the second driving transistor T4 is connected to a low level input end inputting a low level VGL, and a source electrode of the second driving transistor T4 is connected to the pull-down node PD.

The reset circuit 13 includes a first reset transistor T5 and a second reset transistor T6. A gate electrode of the first reset transistor T5 is connected to the reset end RESET, a drain electrode of the first reset transistor T5 is connected to the pull-down node PD, and a source electrode of the first reset transistor T5 is connected to the high level input end inputting a high level VGH. A gate electrode of the second reset transistor T6 is connected to the reset end RESET, a drain electrode of the second reset transistor T6 is connected to the pull-up node PU, and a source electrode of the second reset transistor T6 is connected to the low level input end inputting a low level VGL.

The output circuit 12 includes a first output transistor T1 and a second output transistor T2. A gate electrode of the first output transistor T1 is connected to the pull-down node PD, and a drain electrode of the first output transistor T1 is connected to the low level input end inputting the low level VGL, and a source electrode of the first output transistor T1 is connected to the gate driving signal output end GOUT in the current stage. A gate electrode of the second output transistor T2 is connected to the pull-up node PU, a drain electrode of the second output transistor T2 is connected to the gate driving signal output end GOUT in the current stage, and the source electrode of the second output transistor T2 is connected to the output signal providing end OP.

The storage capacitor circuit 14 includes a storage capacitor Cs, a first end of the storage capacitor Cs is connected to the pull-up node PU, and a second end of the storage capacitor Cs is connected to the gate driving signal output end GOUT in the current stage.

In the shift register unit as shown in FIG. 2, T1, T2, T3, T4, T5 and T6 are all n-type transistors. However, in actual operation, the above transistors can also be replaced with p-type transistors, as long as the time sequence for controlling the control signals of the transistors can be changed accordingly.

In the shift register unit shown in FIG. 2, the set signal input end SET is connected to a first clock signal input end CKV1 (CKV1 is not shown in FIG. 2), and the output signal providing end OP is connected to a second clock signal input end CKV2 (CKV2 is not shown in FIG. 2), and the reset end RESET is connected to a third clock signal input end CKV3 (CKV3 is not shown in FIG. 2).

Figure 3:
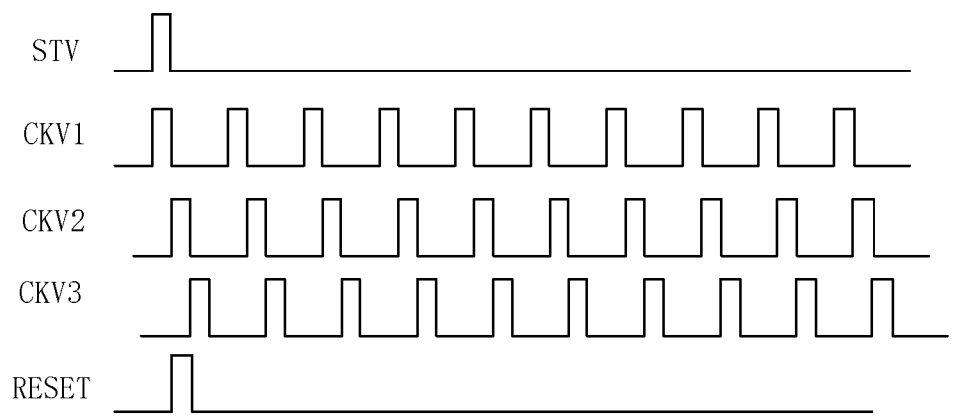
FIG. 3 is a time sequence showing the operation of the shift register unit in FIG. 2.

As shown in FIG. 3, the first clock signal inputted by the first clock signal input end CKV1, the second clock signal inputted by the second clock signal input end CKV2, and the third clock signal inputted by the third clock signal input end CKV3 each has a duty ratio of 1/4, and the period of the first clock signal, the period of the second clock signal, and the period of the third clock signal are all T. The second clock signal is delayed by T/4 from the first clock signal; the third clock signal is delayed by T/4 from the second clock signal; the fourth clock signal is delayed by T/4 from the third clock signal.

As shown in FIG. 3, the shift register unit shown in FIG. 2 is in operation. Each display period includes an initial stage S1, an output stage S2 and a reset stage S3.

In the initial stage S1, the first clock signal input end CKV1 and the start end STV are both inputted with a high level, and the second clock signal input end CKV2 and the third clock signal input end CKV3 are both inputted with a low level. Under the control of the start end STV, both T3 and T4 are turned on, so that the pull-up node PU is connected to the first clock signal input end CKV1 and the pull-down node PD is connected to the low level input end inputting the low level VGL, so that the potential of the pull-up node PU is at a high level and the potential of the pull-down node PD is at a low level. T1 is turned off under the control of a voltage at the pull-down node PD, and T2 is turned on under the control of a voltage at the pull-up node PU, so as to control the driving signal output end GOUT in the current stage being connected to the second clock signal input end CKV2, so that the driving signal output end GOUT in the current stage outputs a low level, both T5 and T6 are turned off under the control of the third clock signal input end CKV3.

In the output stage S2, the first clock signal input end CKV1, the start end STV and the third clock signal input end CKV3 are each inputted with a low level, and the second clock signal input end CKV2 is inputted with a high level. Under the control of the start end STV, both T3 and T4 are turned off to disconnect the connection between the pull-up node PU and the first clock signal input end CKV1 and disconnect the connection of the pull-down node PD and the low level input end inputting the low level VGL. The storage capacitor Cs is bootstrapped to pull up the potential of the pull-up node PU. Under the control of a voltage at the pull-up node PU, T2 continues to be turned on to control the connection of the driving signal output end GOUT in the current stage and the second clock signal input end CKV2, so that the driving signal output end GOUT in the current stage outputs a high level; both T5 and T6 are turned off under the control of the third clock signal input end CKV3.

In the reset phase S3, the third clock signal input end CKV3 inputs a high level, and under the control of the third clock signal input end CKV3, both T5 and T6 are turned on to connect the pull-up node PU to the low level input end inputting the low level VGL, and connect the pull-down node PD to the high level input end inputting the high level VGH, so that the potential of the pull-up node PU is at a low level and the potential of the pull-down node PD is at a high level. Under the control of a voltage at the pull-up node PU, T1 is turned off to disconnect the connection between the gate driving signal output end GOUT in the current stage and the second clock signal input end CKV. Under the control of a voltage at the PD, T1 is turned on to connect the gate driving signal output end GOUT in the current stage to the low level input end inputting the low level VGL, so as to reset the gate driving signal output end GOUT in the current stage, so that the gate driving signal output end GOUT in the current stage outputs a low level.

Compared with the related art, the shift register unit shown in FIG. 2 only needs to add two TFTs, which can solve the problem of output dither of the gate driving signal, and at the same time, a gate drive circuit arranged on the array substrate (GOA) has a more stable voltage at an internal node (the internal node refers to the pull-up node), which reduce the possibility of faulty operation of the shift register unit.

The shift register unit shown in FIG. 2 of the present disclosure has a structure of 6T1C, and the quantity of TFTs is small, and a narrow bezel can be well realized.

The method for driving the shift register unit according to some embodiments of the present disclosure is applied to the above shift register unit, and the method includes the following within each display period.

In an initial stage, the set signal input end and the start end both input a second level, and the output signal providing end inputs a first level; under the control of the start end, the drive circuit control to connect the pull-up node and the set signal input end, and connect the pull-down node and the first level input end; so that the potential of the pull-up node is at a second level and the potential of the pull-down node is at a first level; and under the control of a voltage at the pull-up node, the output circuit control to connect the driving signal output end in the current stage to the output signal providing end, so that the driving signal output end in the current stage outputs the first level.

In the output stage, the set signal input end and the start end both input the first level, and the output signal providing end inputs the second level. Under the control of the start end, the drive circuit controls to disconnect the pull-up node and the set signal input end, and control to disconnect the pull-down node and the first level input end, the storage capacitor circuit bootstraps the potential of the pull-up node. Under the control of a voltage at the pull-up node, the output circuit continues to control the driving signal output end in the current stage to be connected to the output signal providing end, so that the gate driving signal output end in the current stage outputs the second level.

In the reset phase, the reset end inputs a second level, and under the control of the reset end, the reset circuit controls the pull-up node to be connected to the first level input end, and controls the pull-down node to be connected to the second level input end, so that the potential of the pull-up node is at a first level and the potential of the pull-down node is at a second level. Under the control of a voltage at the pull-up node, the output circuit controls to disconnect the gate driving signal output end in the current stage and the output signal providing end. Under the control of a voltage at the pull-down node, the output circuit controls the gate driving signal output end in the current stage to be connected to the first level input end, to reset the gate driving signal output end in the current stage.

The method for driving the shift register unit according to the embodiment of the present disclosure is applied to the shift register unit described above, within each display period, in the initial stage, the driving circuit inputs a set signal to the output circuit; in the output stage, the output circuit outputs the final gate driving signal to turn on the channel of the TFT at the AA; in the reset phase, the reset circuit resets the gate driving signal to turn off the channel of the TFT at the AA.

A gate driving circuit of some embodiments of the present disclosure includes a plurality of stages of the above shift register unit. In addition to the shift register unit in the last stage, the gate signal output end of the shift register unit in each stage is connected to the start end of a shift register unit in an adjacent next stage.

In actual operation, in the gate driving circuit of some embodiments of the present disclosure, the set signal input end of the shift register unit in the 4n-3rd stage is connected to the first clock signal input end, and the output signal providing end of the shift register unit in the 4n-3rd stage is connected to the second clock signal input end, and the reset end of the shift register unit in the 4n-3th stage is connected to the third clock signal input end.

The set signal input end of shift register unit in the 4n-2nd stage is connected to the second clock signal input end, and the output signal providing end of the shift register unit in the 4n-2nd stage is connected to the third clock signal input end, the reset end of the shift register unit in the 4n-2nd stage is connected to the fourth clock signal input end.

The set signal input end of the shift register unit in the 4n-1st stage is connected to the third clock signal input end, and the output signal providing end of the shift register unit in the 4n-1st stage is connected to the fourth clock signal input end, the reset end of the shift register unit in the 4n-1st stage is connected to the first clock signal input end.

The set signal input end of the shift register unit in the 4nth stage is connected to the fourth clock signal input end, and the output signal providing end of the shift register unit in the 4nth stage is connected to the first clock signal input end, and the reset end of the shift register unit in the 4nth stage is connected to the second clock signal input end, where n is a positive integer, and 4n is less than or equal to the number of stages of the shift register units included in the gate driving circuit.

Figure 4:
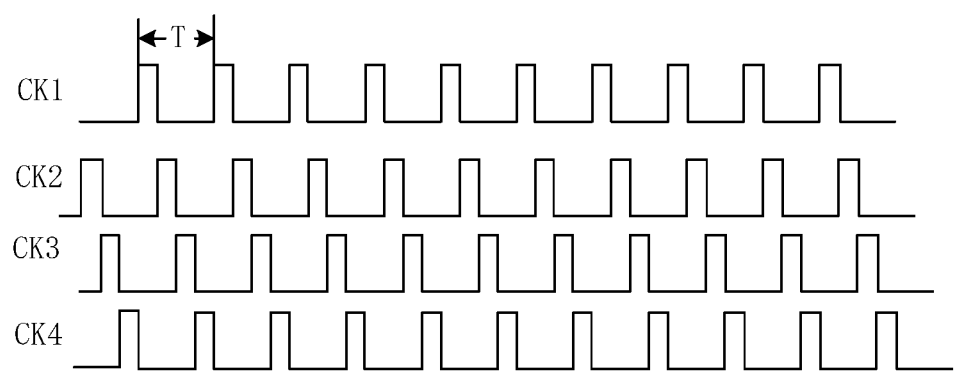
FIG. 4 is a time sequence showing four clock signals according to some embodiments of the present disclosure.

As shown in FIG. 4, the duty ratios of the first clock signal CK1, the second clock signal CK2, the third clock signal CK3, and the fourth clock signal CK4 are all 1/4, and the period of the first clock signal CK1, the period of the second clock signal CK2, the period of the third clock signal CK3, and the period of the fourth clock signal CK4 are all T.

The second clock signal CK2 is delayed by T/4 from the first clock signal CK1; the third clock signal CK3 is delayed by T/4 from the second clock signal CK2; the fourth clock signal CK4 is delayed by T/4 from the third clock signal CK3.

The gate drive circuit of the present disclosure will be described below by way of a specific embodiment.

Figure 5:
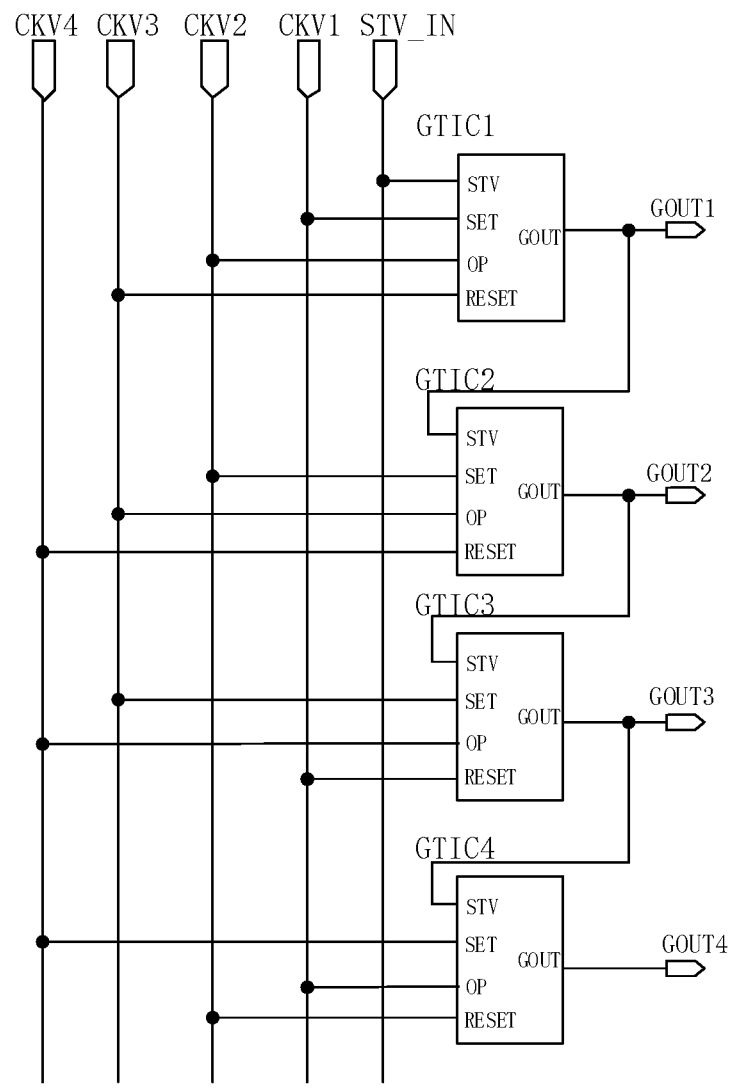
FIG. 5 is a schematic view showing a structure of the gate driving circuit according to some embodiments of the present disclosure.

As shown in FIG. 5, the gate driving circuit of the present disclosure includes a shift register unit in the first stage GTIC1, a shift register unit in the second stage GTIC2, a shift register unit in the third stage GTIC3, and a shift register unit in the fourth stage GTIC4. The gate drive circuit of the present disclosure may include a plurality of stages of shift register units, and FIG. 5 only shows the connection relationship of the shift register units in four stages as an example.

As shown in FIG. 5, the start end of the shift register unit in the first stage GTIC1 is connected to the external start signal input end STV_IN, and the set signal input end of the shift register unit in the first stage GTIC1 is connected to the first clock signal input end CKV1. The output signal providing end of the shift register unit GTIC1 in the first stage is connected to the second clock signal input end CKV2, and the reset end RESET of the shift register unit in the first stage GTIC1 is connected to the third clock signal input end CKV3.

The start end of the shift register unit in the second stage GTIC2 is connected to the first gate driving signal output end GOUT1 of the shift register unit in the first stage GTIC1, and the set signal input end of the shift register unit in the second stage GTIC2 is connected to and the second clock signal input end CKV2, the output signal providing end of the shift register unit in the second stage GTIC2 is connected to the third clock signal input end CKV3, and the reset end of the shift register unit in the second stage GTIC2 is connected to the fourth clock signal input end CKV4.

The start end of the shift register unit in the third stage GTIC3 is connected to the second gate driving signal output end GOUT2 of the shift register unit in the second stage GTIC2, and the set signal input end of the shift register unit in the third stage GTIC3 is connected to the third clock signal input end CKV3, the output signal providing end of the shift register unit in the third stage GTIC3 is connected to the fourth clock signal input end CKV4, and the reset end of the shift register unit in the third stage GTIC3 is connected to the first clock signal input end CKV1.

The start end of the shift register unit in the fourth stage GTIC4 is connected to the third gate driving signal output end GOUT3 of the shift register unit in the third stage GTIC3, and the set signal input end of the shift register unit in the fourth stage GTIC4 is connected to the fourth clock signal input end CKV4, the output signal providing end of the shift register unit in the fourth stage GTIC4 is connected to the first clock signal input end CKV1, and the reset end of the shift register unit in the fourth stage GTIC4 is connected to the second clock signal input end CKV2.

As shown in FIG. 5, the reference number STV refers to the start end of the shift register unit in each stage and SET refers to the set signal input end of the shift register unit in each stage, and OP refers to the output signal providing end of the shift register unit in each stage, RESET refers to the reset end of the shift register unit in each stage, and GOUT refers to the gate driving signal output end of the shift register unit in each stage.

The gate driving signal output end of the shift register unit in the first stage GTIC1 is connected to the first gate driving signal output end GOUT1. The gate driving signal output end of the shift register unit in the second stage GTIC2 is connected to the second gate driving signal output end GOUT2. The gate driving signal output end of the shift register unit in the third stage GTIC3 is connected to the third gate driving signal output end GOUT3. The gate driving signal output end of the shift register unit in the fourth stage GTIC4 is connected to the fourth gate driving signal output end GOUT4.

According to the cascading mode as shown in FIG. 5, simulation for 24 stages is performed, and the gate driving signal is outputted normally.

The display device of the present disclosure includes the above gate driving circuit.

The display device provided in the embodiments may be any product or component having a display function, such as a display, a mobile phone, a tablet computer, a television, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driving circuit, comprising a plurality of stages of shift registers units, wherein
in addition to the shift register unit in the last stage, the gate signal output end of the shift register unit in each stage is connected to the start end of a shift register unit in an adjacent next stage, wherein the shift register unit comprises: a driving circuit a storage capacitor circuit an output circuit and a reset circuit, wherein the driving circuit is respectively connected to a starting end, a pull-up node, a pull-down node, a first level input end and a set signal input end, and configured to control whether the pull-up node is connected to the set signal input end and whether the pull-down node is connected to the first level input end under the control of the start end;

the output circuit is respectively connected to the pull-up node, the pull-down node, the first level input end, an output signal providing end, and a gate driving signal output end in a current stage, and configured to control whether the gate driving signal output end in the current stage is connected to the output signal providing end under the control of a voltage at the pull-up node, and whether the gate driving signal output end in the current stage is connected to the first level input end under the control of a voltage at the pull-down node;

the storage capacitor circuit is connected between the pull-up node and the gate driving signal output end in the current stage; and the reset circuit is respectively connected to a reset end, a second level input end, the pull-up node, the pull-down node, and the first level input end, and configured to control whether the pull-up node is connected to the first level input end under the control of the reset end, and control whether the pull-down node is connected to the second level input end, wherein the set signal input end of the shift register unit in a 4n-3rd stage is connected to a first clock signal input end, and the output signal providing end of the shift register unit in the 4n-3rd stage is connected to a second clock signal input end, and the reset end of the shift register unit in the 4n-3rd stage is connected to a third clock signal input end;

a set signal input end of shift register unit in a 4n-2nd stage is connected to the second clock signal input end, and the output signal providing end of the shift register unit in the 4n-2nd stage is connected to the third clock signal input end, the reset end of the shift register unit in the 4n-2nd stage is connected to a fourth clock signal input end;

the set signal input end of the shift register unit in a 4n-1st stage is connected to the third clock signal input end, and the output signal providing end of the shift register unit in the 4n-1st stage is connected to the fourth clock signal input end, the reset end of the shift register unit in the 4n-1st stage is connected to the first clock signal input end;

the set signal input end of the shift register unit in a 4nth stage is connected to the fourth clock signal input end, and the output signal providing end of the shift register unit in the 4nth stage is connected to the first clock signal input end, and the reset end of the shift register unit in the 4nth stage is connected to the second clock signal input end, where n is a positive integer, and 4n is less than or equal to a quantity of stages of the shift register units included in the gate driving circuit;

duty ratios of a first clock signal, a second clock signal, a third clock signal, and a fourth clock signal are all 1/4, and periods of the first clock signal, the period of the second clock signal, the period of the third clock signal, and the period of the fourth clock signal are all T; and the second clock signal is delayed by T/4 from the first clock signal; the third clock signal is delayed by T/4 from the second clock signal; the fourth clock signal is delayed by T/4 from the third clock signal.

2. A display device, comprising the gate driving circuit according to claim 1.

3. The gate driving circuit according to claim 1, wherein the driving circuit comprises a first driving transistor and a second driving transistor;
- a gate electrode of the first driving transistor is connected to the start end, a first electrode of the first driving transistor is connected to the pull-up node, and a second electrode of the first driving transistor and the set signal input end; and
- a gate electrode of the second driving transistor is connected to the start end, a first electrode of the second driving transistor is connected to the first level input end, a second electrode of the second driving transistor is connected to the pull-down node.

4. The gate driving circuit according to claim 3, wherein the reset circuit comprises a first reset transistor and a second reset transistor;
- a gate electrode of the first reset transistor is connected to the reset end, a first electrode of the first reset transistor is connected to the pull-down node, and a second electrode of the first reset transistor is connected to the second level input end; and
- a gate electrode of the second reset transistor is connected to the reset end, a first electrode of the second reset transistor is connected to the pull-up node, and a second electrode of the second reset transistor is connected to the first level input end.

5. The gate driving circuit according to claim 4, wherein the output circuit includes a first output transistor and a second output transistor;
- a gate electrode of the first output transistor is connected to the pull-down node, a first electrode of the first output transistor is connected to the first level input end, a second electrode of the first output transistor is connected to the gate driving signal output end; and
- a gate electrode of the second output transistor is connected to the pull-up node, a first electrode of the second output transistor is connected to the gate driving signal output end in the current stage, and a second electrode of the second output transistor is connected to the output signal providing end.

6. The gate driving circuit according to claim 5, wherein the first driving transistor, the second driving transistor, the first output transistor, the second output transistor, the first reset transistor, and the second reset transistor are all n-type transistors.

7. The gate driving circuit according to claim 5, wherein the first driving transistor, the second driving transistor, the first output transistor, the second output transistor, the first reset transistor, and the second reset transistor are all p-type transistors.

8. The gate driving circuit according to claim 1, wherein the storage capacitor circuit comprises a storage capacitor, a first end of the storage capacitor is connected to the pull-up node, and a second end of the storage capacitor is connected to the gate driving signal output end in the current stage.

* * * * *